United States Patent [19]

Frijlink

[11] Patent Number: 5,027,746
[45] Date of Patent: Jul. 2, 1991

[54] EPITAXIAL REACTOR HAVING A WALL WHICH IS PROTECTED FROM DEPOSITS

[75] Inventor: Peter Frijlink, Crosne, France

[73] Assignee: U.S. Philips Corporation, New York, N.Y.

[21] Appl. No.: 326,576

[22] Filed: Mar. 21, 1989

[30] Foreign Application Priority Data

Mar. 22, 1988 [FR] France .................................. 88 03689

[51] Int. Cl.⁵ .............................................. C23C 16/00
[52] U.S. Cl. .................................... 118/724; 118/715;
                                                      118/725; 118/730
[58] Field of Search ................ 118/715, 724, 725, 730

[56] References Cited

U.S. PATENT DOCUMENTS

| | | | |
|---|---|---|---|
| 4,579,080 | 4/1986 | Martin | 118/724 |
| 4,596,208 | 6/1986 | Wolfson | 118/724 |
| 4,641,603 | 2/1987 | Miyazaki | 118/724 |
| 4,682,566 | 7/1987 | Aitken | 118/724 |

FOREIGN PATENT DOCUMENTS

| | | | |
|---|---|---|---|
| 59-112611 | 6/1984 | Japan | 118/724 |
| 61-086497 | 5/1986 | Japan | 118/715 |
| 61-103531 | 5/1986 | Japan | 118/724 |
| 62-280367 | 12/1987 | Japan | 118/724 |

*Primary Examiner*—Richard Bueker
*Attorney, Agent, or Firm*—Norman N. Spain

[57] ABSTRACT

An epitaxial growth reactor for processing wafers (1) of a semiconductor material by exposing it to a reactive gas flow. A wall (8) positioned at a slight distance from the wafer or group of wafers which is exposed to the reactive gas in a double wall, with a very narrow space (34) between the two walls, and this space is filled with a mixture whose composition can be varied and, consequently, the thermal conductivity can be adjusted.

The mixture used is a hydrogen/argon mixture, the proportion of each of these gasses in the mixture being adjustable.

The interior wall (8) of the double wall is a quartz plate and the exterior wall (9) is made of metal. Relevant FIG.: 1.

8 Claims, 1 Drawing Sheet

EPITAXIAL REACTOR HAVING A WALL WHICH IS PROTECTED FROM DEPOSITS

BACKGROUND OF THE INVENTION

The invention relates to an epitaxial growth reactor for processing at least one semiconductor wafer by exposing it to a reactive gas flow the wafer being heated and giving off heat.

The walls of epitaxial growth reactors tend to become soiled by deposits produced by a reaction between the reactive products used.

In the case in which the wafers are in a horizontal position, the problem of deposits is particularly serious, since these deposits have a tendency to flake under the influence of differences in the coefficients of expansion and to cause fragments to fall on the wafers. Each fragment results in defects in one of the plurality of circuits under construction (each wafer is subdivided in a large number of circuits).

Soiling of the walls of the epitaxial growth reactors, which is particularly annoying near the useful surfaces of the wafers can be prevented by raising the walls to a predetermined temperature.

A means to achieve this is to provide a temperature control of the walls. This is taught by the document JP.A. 60 262418. The reactor described in this document includes a helical pipe applied on the reactor wall and in which a fluid is circulated. The temperature of the wall is controlled in that the temperature is measured and, by feedback, acts on a valve regulating the flow rate of the fluid. However, such a means is complicated and expensive.

SUMMARY OF THE INVENTION

A principal object of the invention is to provide a simple and cheap means of providing a wall for an epitaxial growth reactor having a desired temperature.

The invention is based on the idea that it is sufficient to regulate the drain of heat across the wall to the exterior to obtain any desired wall temperature, less than the temperature of the wafers.

In order to put this means into effect, the reactor according to the invention is characterized in that, the thermal conductivity of a wall of the reactor vessel being positioned at a small distance from the wafer exposed to the reactive gas, is controllable, because of the fact that at some small distance from its interior face located opposite the wafer a hollow space is provided which, during operation, contains a fluid mixture whose composition can be changed, this space being sufficiently narrow to allow the heat to be drawn off from it by conduction.

DETAILED DESCRIPTION OF THE INVENTION

Advantageously, the wall is a roughly flat cover placed immediately above the wafer(s)

Advantageously, the mixture used is a gas mixture, the mixture preferably being a mixture of hydrogen and argon, the proportion of each of them in the mixture being adjustable.

In an advantageous embodiment, the wall is constituted by an interior quartz plate which is very suitable for being in contact with the reactive gas, and a metal exterior wall. Said space is constituted by a spacing formed between the quartz plate and the metal wall. The exterior wall is a good heat conductor, and thus the thermal resistance of the assembly depends above all on the characteristics of the mixture fed into the narrow space.

So as to obtain a thermal profile producing depositions of a constant thickness, the space is divided into a plurality of portions to which gas is supplied independently and individually.

The following description which is given by way of non-limitative example with reference to the accompanying drawings will make it better understood how the invention can be carried into effect.

Figure 1:
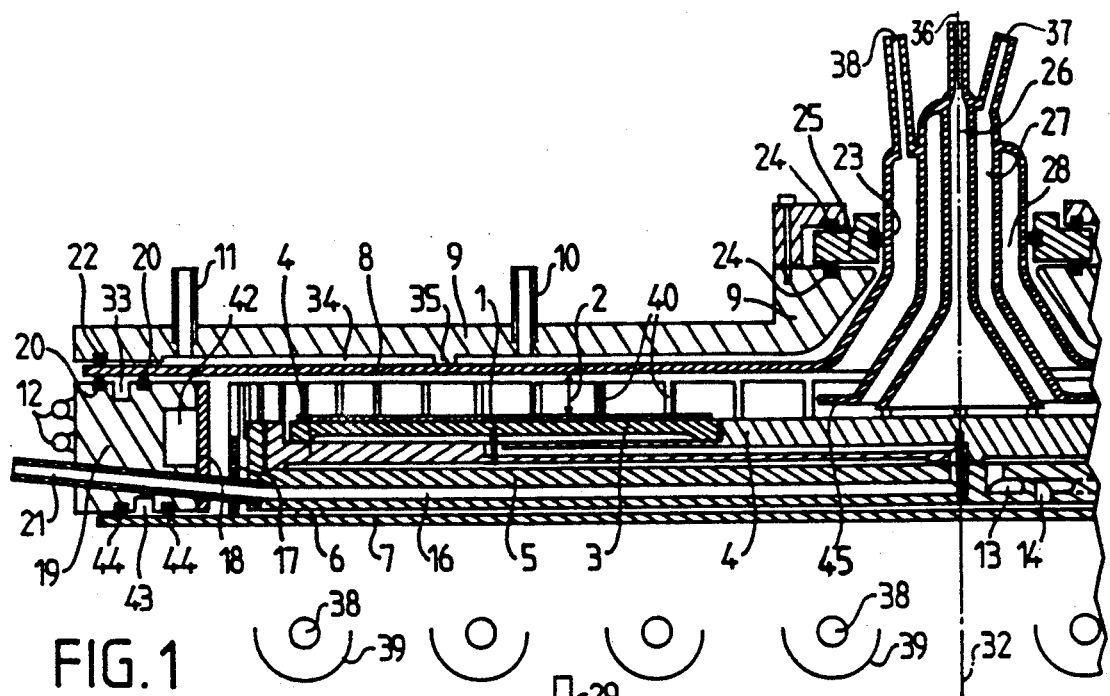
FIG. 1 is a lateral half-sectional view (taken on line AA of FIG. 2) of a reactor according to the invention which reactor processes five wafers simultaneously.

So as to enable the realization of a drawing to a larger scale, FIG. 1 shows only little more than half a reactor. The part not shown can easily be derived from the elements shown, with the aid of FIG. 2.

The wafer support is formed by a fixed graphite disk 5 in which holes are made to admit a gas by means of which the wafer supporting disks can be lifted slightly and be caused to rotate. The disk 5 carries a main spin disk 4 having a diameter of approximately 25cms and, in its turn, this disk carries a plurality of secondary spin disks 3 on each of which a semiconductor wafer or slice is placed. A tube 21 through which floating gas can be fed penetrates into the stationary disk 5. This device is described in detail in FR-A-2 596070 which may be consulted as an example for producing such a device.

The vessel of the reactor is constituted by a cylindrical member 19 having a vertical axis 32 of a round cross-section onto which a cover 8 and a bottom 7 are sealed.

This member is cooled by a helical arrangement of tubes 2 soldered thereto and in which water circulates. The member is made of stainless steel.

The bottom of the vessel is formed by a simple round quartz plate 7 whose width is approximately 4mm. The seal is ensured by 2 O-rings between which a groove 43 is made which is evacuated.

Infrared tubular lamps 38 provided with reflectors 39 which supply infra-red radiation which passes through the bottom 7 and heat the graphite support 5, are disposed on the bottom 7. The use of a plurality of lamps renders it possible to modulate their relative power to obtain a perfectly regular heating from the centre to the exterior of the disk.

The cover is formed by a quartz disk 8 (FIG. 1) whose width is approximately 4mm and which is applied on O-rings 20 between which a groove 33 is made similar to the groove 43 at the interior part. The central part of the cover is a funnel shaped inlet 28. Reactive gas can be fed into this funnel shaped inlet via the tube 38. The interior of the funnel shaped inlet 28 is provided with two further concentric funnel shaped inlets 26 and 27. The lower portions of these inlets are funnel-shaped with the flared end facing downwards. Each inlet 26 and 27 is in connection with a reactive gas source via tubes 36 and 37, respectively. The inner tube 36 may convex, for example, arsine or phosphine prediluted in hydrogen; the second tube 37 may convey, for example, hydrogen, and the second exterior pipe 38 may convey, for example, a mixture of an organometallic substance diluted in alcohol. The reactive gasses flow into the space 2 between the wafers 1 and the cover 8, thereafter flow through slits 40 made in a quartz ring 17 which surrounds the support 5, thereafter through an annular space between the ring 17 and a further quartz ring 18, and finally are discharged via tubes (29 in FIG. 2.)

These reactive gases produce a deposit on the wafers, which is a desired effect, but also on the interior wall of the cover 8. In the long run these deposits accumulate and then flake off and particles fall on the wafers during processing, causing a large number of defects at their surface.

As regards the metal portion of the member 19 and the graphite bottom side of the support of the wafers, the deposits, which are here less annoying than on the cover, can be avoided by preventing contact with the reactive gas. For this the member 19 is provided with an additional quartz wall 18, and hydrogen is fed into a cylindrical groove 42 and enters into the vessel while passing through the space between the member 19 and the wall 18, creating a counter-flow of hydrogen. Similarly, a tube ending 14 provided near the lower end of the support 5 creates there a counter-flow of hydrogen which sweeps the bottom side of the support.

Figure 2:
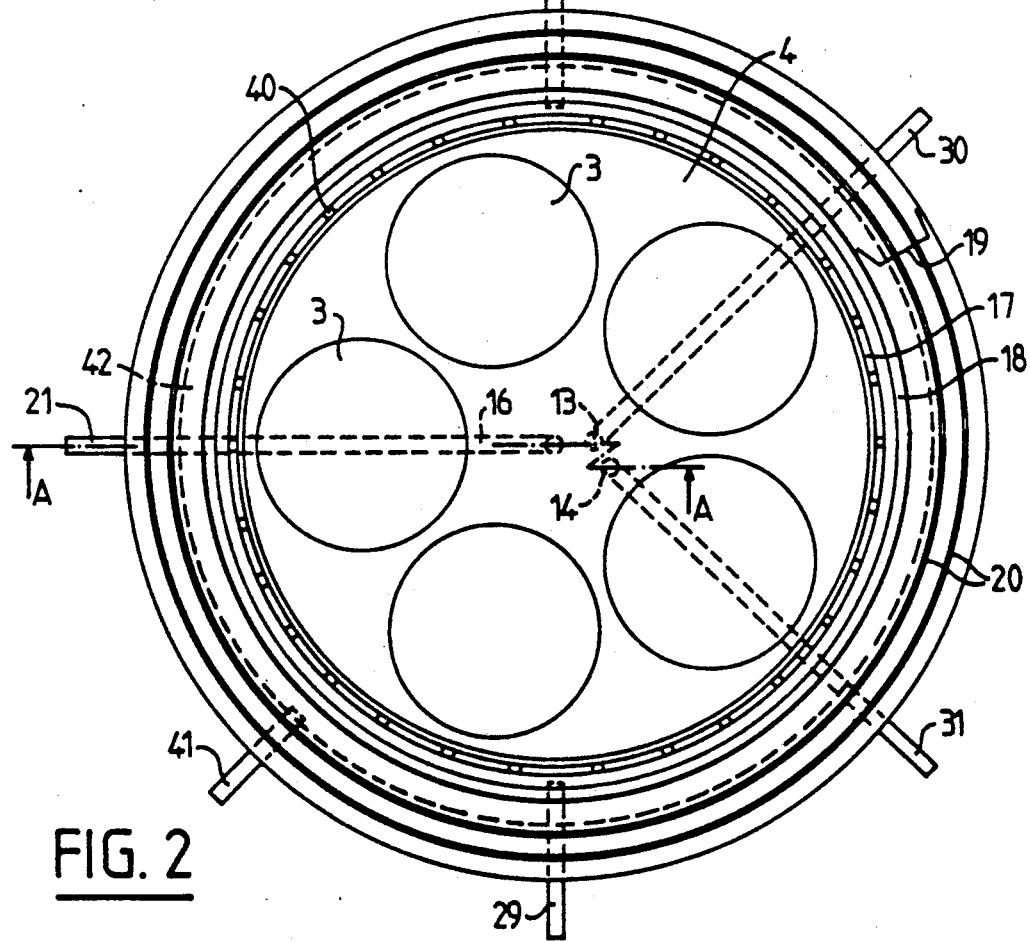
FIG. 2 is a plan view of the same reactor, with raised cover, in a reduced scale of approximately half of the scale of FIG. 1.

In FIG. 2, which shows the reactor with raised cover, the arrangement of the several tubes which pass through the member 19 is shown: the feed tube 21 for the floating gas which ends in the graphite block 5, the tube 31 which ends in 14 for having the gas flow under the wafer support assembly, the tube 31 which ends in 13 to supply the floating gas for the main spin disk 4, the hollow tube 16 in the stationnary portion of the wafer support which conveys the gas intended for the secondary disks, the tube 41 conveying gas into the annular groove 42, and the tubes 29 for discharging the reactive gas. The main spin disk 4 shown here supports five secondary disks 3 having a diameter of 7.62cms.

It is not possible to prevent the reactive gas from contacting the cover 8 which bounds the space where the epitaxy is produced; Moreover, it is nevertheless possible to prevent the formation of deposits there, as it has been stated that these deposits form at certain temperatures and not at others. For the low temperatures of the interior surface of the cover there are, for example, using the gases that have been mentioned deposits of arsenic or phosphor. If, however the temperature is high, deposits of gallium arsenide are formed, or other III-V compounds. On the other hand it was found that, at an intermediate temperature, of the order of 450° C., only a very small deposit is produced, in this case of the III-V compounds.

The assembly of the wafers 5, 4, 3 and the wafers 1 themselves is heated (by the lamps 38) and radiates heat; this radiation is sufficient to elevate the temperature of the cover 8, which is very near, and for that reasons means are provided in the prior art for controlling the temperature thereof. In contrast thereto, the invention proposes a control of the temperature by adjusting the conductivity across the wall to an optimum value.

The cover 8 (FIG. 1) is held under a metal member 9 which causes it to bear against the member 19. Between the metal member 9 and the cover 8 a space 34 is formed which, to control the temperature of the cover, can be filled with a suitable fluid, via the tubes 10 and 11. The sealing of the space is effected by means of 0-rings 22, 23, 24. An annular member 25 is provided which is capable of sliding member relative to the piece 9 and has for its object to prevent breaking of the quartz cover during mounting. The metal member 9 is cooled at its exterior side by means, not shown, which may, for example, be water pipes similar to the tubes 12, or hollow passages made in the member 9 through which water is caused to circulate.

The interior surface of the cover 8, which is formed of a quartz plate, is located opposite to and at a slight distance from the wafers. THe cover 8 is heated by radiation from members 1, 3 and 4. The metal member 9 is a good heat conductor and is cooled by water circulation. A space 34 separates cover 8 from metal member 9. The space 34 separating these two members 8 and 9 has a thickness of approximately 0.3 to 0.5mm. This space is very thin and consequently the transfer of heat to the exterior via this space is basically effected by conduction and not by convection and depends on the thermal conduction coefficient of the fluid with which it is filled.

The fluid used here is a gas mixture of gases. Since argon has an approximately ten times poorer conduction than hydrogen, a mixture of these two gasses can have a thermal conduction which varies in a ratio of ten according to the proportions used in the mixture. It is therefore sufficient to have the proportions of argon and hydrogen fed forward by the fill tubes 10,11 vary to obtain a controllable thermal conduction by means of which it is possible to adjust the temperature of the inner surface of the cover to around 450° C.

It should be noted that this fluid is not a cooling fluid (which removes calories because of its calorific powers associated with a fluid flow) but only constitutes a wall with variable conductivity. It is therefore of no use to provide a flow for this fluid, except to replace it when one wants to vary its composition. To this end a fluid outlet must be provided, preferably in a position diamatrically opposite that of the tubes 10, 11, i.e.for the situation shown in FIG. 1 in the right-hand portion, not shown.

In order to improve the uniformity of the thickness of the deposited material, the space 34 is divided into several portions. In the present example, the metal member 9 has a round rib 35 which touches the upper surface of the quartz cover 8 and splits the space 34 into two concentric portions, each fed by a separate tube 10 or 11. It is consequently possible to supply a mixture having a different thermal conductivity in each of these portions. This renders it possible to vary the temperature profile along a diameter of the quartz wall 8.

In addition, when the gasses heated to an elevated temperature by a previous contact with the support 4 rise thereafter towards the cover, the interior rim of the wall which separates the gas inlet funnels 27 and 28 is flattened to form a ring 45, so as to prevent the flow coming from the funnel 28 to be conveyed directly to the support 4. This ring 45 may alternatively be made of metal (molybdenum) and may be fitted on the quartz cone formed of the funnel shaped inlet of the cover 8.

I claim:

1. An epitaxial growth reactor for processing at least one semiconductor wafer by exposing said wafer to a flow of a reactive gas while said wafer is being heated and gives off heat, said reactor comprising a side wall portion, a cover wall portion, means for supporting said wafer, means for providing said wafer with said flow of reactive gas and means for heating said gas, at least one of said side wall portion or said cover wall portion comprising an interior wall portion positioned at a small distance from the wafer and facing the wafer, an exterior wall portion positioned at a small distance from said interior wall portion, wherein a hollow space is defined between said interior wall portion and said exterior wall portion, which hollow space is provided with a fluid mixture, and including means to adjust the composition of the fluid mixture during said processing in order to adjust the wall conductivity and which space is sufficiently narrow to allow heat to be drawn off from it, through the fluid mixture substantially by conduction rather than by convection said mixture thereby providing means for controlling the thermal conductivity of said wall portion.

2. The reactor as claimed in claim 1, characterized in that said interior wall portion being constituted by a quartz plate and said exterior wall portion being constituted by a metal plate.

3. A reactor as claimed in claim 1, characterized in that, the wafer(s) being placed on a horizontal support, the cover wall is a substantially flat cover provided immediately above the portion wafer(s).

4. A reactor as claimed in claim 1, characterized in the at the mixture is a gas mixture.

5. A reactor as claimed in claim 4, characterized in that the mixture is a mixture of hydrogen and argon.

6. The reactor as claimed in claim 1, characterized in that the wafer is supported by horizontal support and the cover wall portion is substantially flat as provided immediately above said wafer.

7. A reactor as claimed in claim 1 wherein said hollow space is divided into several portions and said mixture being provided individually and independently in each of said portions.

8. A reactor as claimed in claim 7, characterized in that said hollow space is round and is divided into round concentric portions.

* * * * *